United States Patent
Falck et al.

(10) Patent No.: US 7,268,079 B2
(45) Date of Patent: Sep. 11, 2007

(54) METHOD FOR FABRICATING A SEMICONDUCTOR HAVING A FIELD ZONE

(75) Inventors: Elmar Falck, Ottobrunn (DE); Franz-Josef Niedernostheide, Muenster (DE); Hans-Joachim Schulze, Ottobrunn (DE); Reiner Barthelmess, Soest (DE)

(73) Assignee: Infineon Technologies AG, Munich (DE)

( * ) Notice: Subject to any disclaimer, the term of this patent is extended or adjusted under 35 U.S.C. 154(b) by 10 days.

(21) Appl. No.: 11/207,525

(22) Filed: Aug. 19, 2005

(65) Prior Publication Data

US 2006/0051923 A1    Mar. 9, 2006

(30) Foreign Application Priority Data

Aug. 20, 2004  (DE) ............... 10 2004 040 523

(51) Int. Cl.
  *H01L 21/332*   (2006.01)
(52) U.S. Cl. .............. 438/689; 438/133; 438/135; 438/138; 438/494; 438/495; 257/107; 257/110; 257/133; 257/655; 257/657
(58) Field of Classification Search ............ 438/689; 257/107
See application file for complete search history.

(56) References Cited

U.S. PATENT DOCUMENTS 6,110,763 A * 8/2000 Temple .................. 438/133
6,162,695 A * 12/2000 Hwang et al. ............. 438/309

FOREIGN PATENT DOCUMENTS

| JP | 59075658 | 4/1984 |
| WO | 00/38242 | 6/2000 |
| WO | 02/49114 | 6/2002 |

OTHER PUBLICATIONS

B. Jayant Baliga, "Power Semiconductor Devices", PWS Publishing Company Boston 1996, pp. 82-99.

* cited by examiner

*Primary Examiner*—Shamim Ahmed
*Assistant Examiner*—Maki Angadi
(74) *Attorney, Agent, or Firm*—Dicke, Billig & Czaja, PLLC

(57) ABSTRACT

A method for fabricating a semiconductor and at least one second semiconductor zone of a semiconductor component having a semiconductor body having a first semiconductor zone. At least one field zone arranged in an edge region of the semiconductor body is reduced in size by means of an etching method. In another embodiment, the semiconductor body is partially removed in a region outside the first semiconductor zone. At least one second semiconductor zone is then fabricated in the partially removed region.

29 Claims, 7 Drawing Sheets

METHOD FOR FABRICATING A SEMICONDUCTOR HAVING A FIELD ZONE

CROSS-REFERENCE TO RELATED APPLICATIONS

This Utility Patent Application claims priority to German Patent Application No. DE 10 2004 040 523.9-33, filed on Aug. 20, 2004, which is incorporated herein by reference.

FIELD OF THE INVENTION

The invention relates to a method for fabricating field rings in semiconductor components such as, for example, thyristors, diodes, MOSFETs or IGBTs.

BACKGROUND

Semiconductor components of the aforementioned type generally have a pn junction between two semiconductor regions that are doped complementarily with respect to one another. In this case, a depletion zone having only a few free charge carriers is formed in the region of the pn junction. The depletion zone is also referred to as a depletion layer or as a space charge zone. The space charge zone is reduced in size or enlarged depending on whether the junction is operated in the forward or reverse direction.

An electric field forms in the space charge zone, the strength of the electric field being dependent on the voltage applied to the junction. Particularly in the case of a junction operated in the reverse direction and a high reverse voltage applied to the junction, the electric field of the space charge zone can reach very high values, which may lead to voltage breakdowns in the semiconductor component.

The profile of the electric field results from the gradient of its electrical potential and is therefore often represented on the basis of equipotential lines, that is to say lines which connect points of equal (electrical) potential.

If the electrical conditions established in an electrical component in a specific state are represented on the basis of such equipotential lines, then the regions at increased risk of voltage breakdowns are found where the equipotential lines become greatly compressed.

Such regions at increased risk of voltage breakdowns occurring typically arise at inhomogeneities of the component such as, for example, at surfaces or interfaces, and there in particular at locations with corners, edges or high degrees of curvature. These also include, in particular, semiconductor junctions as are produced e.g., during the fabrication of doped regions.

The risk of breakdown voltages occurring which destroy or at least damage the semiconductor component is particularly high in the edge region, in particular, of the semiconductor component.

In order to avoid such problems, various solution approaches have been developed for planar structures in order to reduce the electric field as uniformly as possible within the edge region. Therefore, a corresponding arrangement is also referred to as an "edge termination" or an "edge structure".

One of these solution approaches provides so-called "field rings". These are at least one doped zone of the semiconductor body of a semiconductor component which is arranged in the edge region thereof and which annularly surrounds the "main or load junction". However, since the principle of a field ring arrangement is not restricted to an annular configuration of the field rings, the latter are referred to hereinafter as "field zones" in generalizing fashion.

Typical exemplary embodiments of such field zone arrangements are illustrated for example in B. Jayant Baliga: "Power Semiconductor Devices", published by PWS Publishing Company, Boston 1996, pages 82-99.

The compression of the equipotential lines as mentioned in the introduction and accompanying this the risk of a voltage breakdown in the semiconductor, which exists primarily in the off state of the semiconductor component, is reduced on account of additional charges being provided in the region of the field zones.

FIG. 1 illustrates a typical field zone arrangement in accordance with the prior art using the example of a diode. A section of the diode is illustrated in cross section. The diode has a semiconductor body 1 having an inner region 40 and an edge region 41 adjacent to the inner region 40 in the lateral direction.

The semiconductor body 1 comprises a first, p-doped semiconductor zone 12, which is arranged in the inner region 40 and forms the p-doped emitter of the diode, and also a number of second semiconductor zones 13 that are arranged in the edge region 41 and are spaced apart from one another and from the first semiconductor zone 12 in the lateral direction. The semiconductor zones 13 represent field rings or field zones of the diode.

A pn junction is formed between a third semiconductor zone 11, which represents the n-doped base of the diode, and the first semiconductor zone 12, said pn junction forming a load junction of the diode.

For production engineering reasons, the first semiconductor zone 12 and also the second semiconductor zones 13 have been fabricated jointly during the same method steps, that is to say the application of a patterned doping mask and the introduction of doping particles into the semiconductor body using the doping mask, and therefore extend into the semiconductor body 1 to the same depth proceeding from a first side of the semiconductor body 1 in the vertical direction thereof, that is to say that the dimension d12 of the first semiconductor zone 12 in the vertical direction of the semiconductor body 1 and the dimension d13 of the second semiconductor zones 13 in the vertical direction of the semiconductor body 1 are identical.

This fabrication method has the disadvantage that the dimension d13 and the region of extent of the field zones 13 in the vertical direction of the semiconductor body 1 are prescribed by the dimension d12 of the first semiconductor zone 12 in the vertical direction of the semiconductor body 1.

SUMMARY

In one embodiment, the invention provides a method for fabricating a semiconductor component and at least one second semiconductor zone of a semiconductor component having a semiconductor body having a first semiconductor zone. At least one field zone arranged in an edge region of the semiconductor body is reduced in size by means of an etching method. In another embodiment, the semiconductor body is partially removed in a region outside the first semiconductor zone. At least one second semiconductor zone is then fabricated in the partially removed region.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Figure 1:
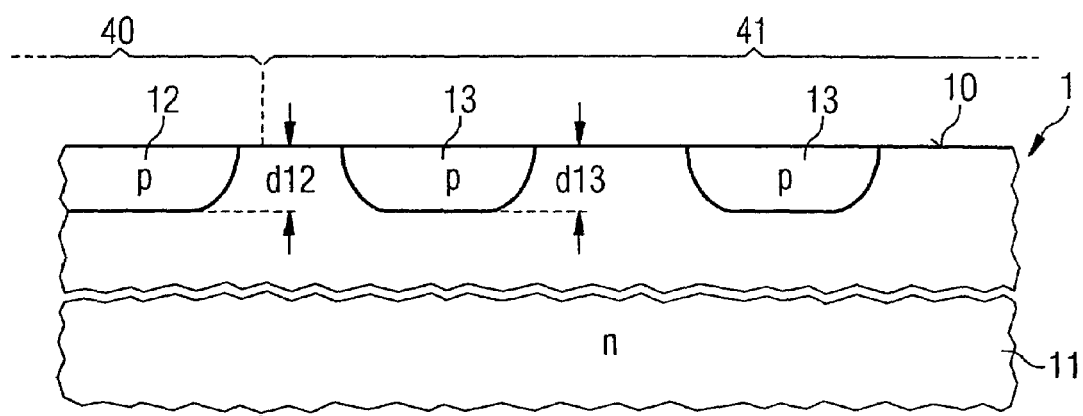
FIG. 1 illustrates in a cross section a section of a semiconductor component in accordance with the prior art.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides a method for fabricating at least one field zone in which the dimension and the region of extent of the at least one field zone in the vertical direction of the semiconductor body of a semiconductor component, and thus also in part its lateral extent, can be set in a flexible manner.

In one embodiment of a first method according to the invention for fabricating at least one field zone of a semiconductor component, firstly a semiconductor body is provided. The semiconductor body has an inner region, an edge region adjoining the inner region in the lateral direction of the semiconductor body, and also a first side. Furthermore, the semiconductor body comprises a first semiconductor zone of a first conduction type in the inner region and at least one second semiconductor zone likewise of the first conduction type in the edge region. The second semiconductor zone has a specific dimension in the vertical direction of the semiconductor body and extends into the semiconductor body proceeding from the first side.

After the provision of a semiconductor body of this type, the latter is etched in patterned fashion at least as far as a predetermined etching depth proceeding from its first side at least in the edge region in order to partially remove the at least one second semiconductor zone.

As a result of the partial removal of the at least one second semiconductor zone, which forms a field ring or a field zone, the properties thereof, such as e.g. the number of dopant atoms within the relevant semiconductor zone or the extent thereof in the vertical and lateral direction of the semiconductor body, can be set in a targeted manner.

In another embodiment, according to the invention for fabricating at least one field zone of a semiconductor component, firstly a semiconductor body is likewise provided, having an inner region and an edge region adjoining the inner region in the lateral direction of the semiconductor body, and also a first side. In its inner region, the semiconductor body comprises a first semiconductor zone of a first conduction type, which has a specific dimension in the vertical direction of the semiconductor body and extends into the semiconductor body proceeding from the first side.

After the provision of the semiconductor body, the latter is etched as far as a predetermined etching depth proceeding from its first side at least in the edge region in order to partially remove the semiconductor body.

Furthermore, at least one second semiconductor zone of the first conduction type having a predetermined dimension in the vertical direction of the semiconductor body is produced by introduction of dopants into the edge region of the semiconductor body.

In this embodiment, the second semiconductor zones, which form the field zones of the semiconductor component, are fabricated independently of the first semiconductor zone. As a result, it is possible for the spatial arrangement and the dimension of the at least one second semiconductor zone to be chosen independently of the first semiconductor zone.

Figure 2:
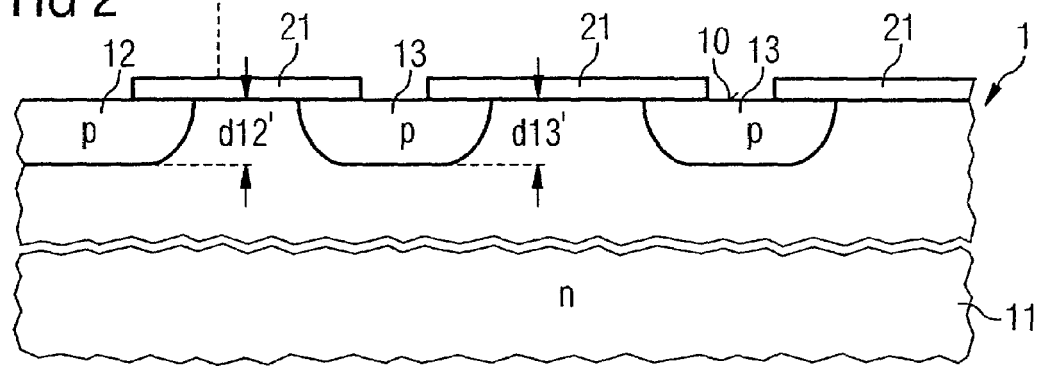
FIG. 2 illustrates in cross section one embodiment of a section of a semiconductor component having first and second semiconductor zones that have been fabricated by implantation of dopants into the semiconductor body using a patterned doping mask and an optional subsequent diffusion step.

FIG. 2 illustrates a cross section through a section of the edge structure of a semiconductor component. The semiconductor component has a semiconductor body 1 having a first side 10, to which a patterned doping mask 21 is applied. By means of the introduction of doping particles, from the first side 10 of the semiconductor body 1, for example by means of implantation, a p-doped first semiconductor zone 12 and also a number of likewise p-doped second semiconductor zones 13 have been produced in the semiconductor body 1 using the patterned doping mask 21.

After an optional heat treatment during which the semiconductor body 1 is brought to an elevated temperature, diffusion processes during which the introduced doping particles propagate in the semiconductor body 1 give rise to an enlargement of the doped region, that is to say of the first and second semiconductor zones 12, 13, both in the lateral and in the vertical direction of the semiconductor body 1. As a result, the lateral dimensions of the first and second semiconductor zones 12, 13 are in each case larger than the lateral dimensions of the openings of the patterned doping mask 21 in the same lateral direction of the semiconductor body 1 as is illustrated in FIG. 2.

After the heat treatment, the first semiconductor zone 12 has a thickness d12' and the second semiconductor zones 13 have thicknesses d13'. The thicknesses d12' and d13' are preferably identical in magnitude at the end of the heat treatment. In this embodiment, the first semiconductor zone 12 and the second semiconductor zones 13 extend into the semiconductor body 1 to the same extent proceeding from the first side 10 of said semiconductor body. After the removal of the patterned doping mask 21, a patterned etching mask 22 is applied to the first side 10 of the semiconductor body 1. The etching mask 22 is patterned in such a way that the semiconductor body is partially removed as far as an etching depth t1 in its edge region 41 during the subsequent etching process, and that the first semiconductor zone 12 is completely preserved. The etching is preferably effected by means of a wet-chemical etching method. However, it is also possible to use dry-chemical etching methods or other methods which are suitable for removing material of the semiconductor body 1. The result of this etching method is illustrated in FIG. 3a.

Figure 3A:
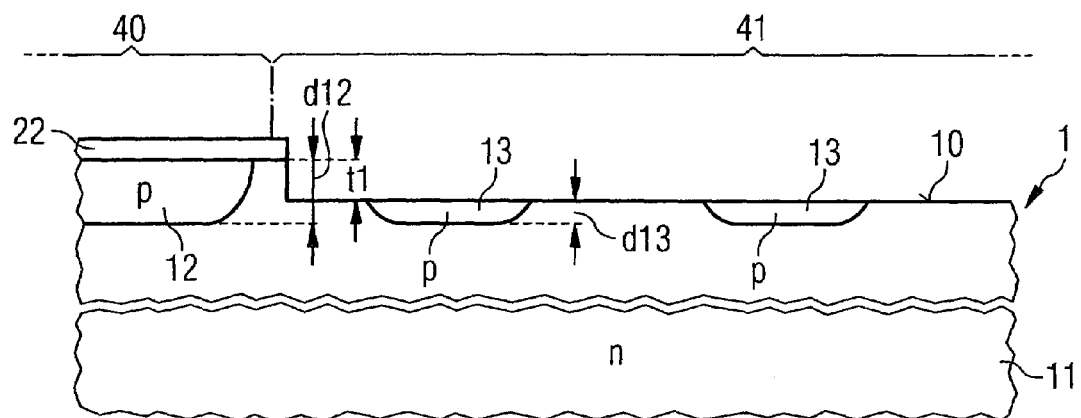
FIG. 3a illustrates in a cross section the section of the semiconductor component in accordance with FIG. 2 in which the semiconductor body has been partially removed in its edge region by means of a technical etching method using a patterned etching mask.
Figure 3B:
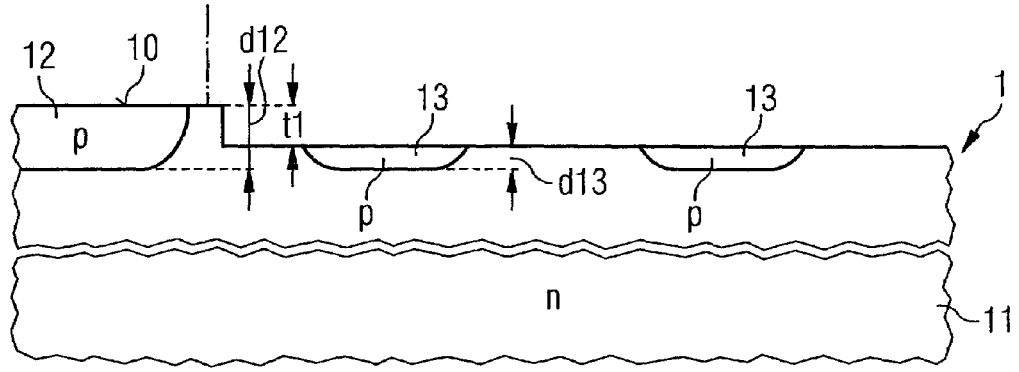
FIG. 3b illustrates in cross section the section of the semiconductor component in accordance with FIG. 3a after the removal of the patterned etching mask.

After the removal of the patterned etching mask 22, as is illustrated in FIG. 3b, the first semiconductor zone 12 has its final thickness d12. The second semiconductor zones 13 correspondingly have their final thicknesses d13. The thicknesses d13 of the second semiconductor zones 13 are less than the thicknesses d12 of the first semiconductor zone 12. The original thicknesses d13' of the second semiconductor zones 13 have been reduced by the etching depth t1 to the thicknesses d13 as a result of the etching of the semiconductor body 1. The sum of the etching depth t1 and the final thickness d13 of the second semiconductor zone 13 is thus equal to the final thickness d12 of the first semiconductor zone. Consequently, the properties of the field rings or field zones which are formed by the second semiconductor zones 13 can be influenced within wide limits through a suitable choice of the etching depth t1.

Figure 4A:
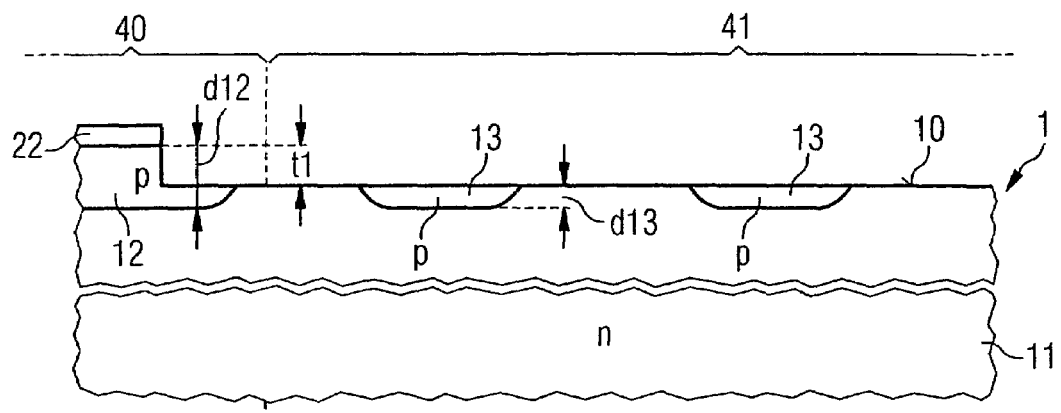
FIG. 4a illustrates the section of the semiconductor component corresponding to FIG. 3a in which the first semiconductor zone has been partially removed during the etching method.

FIG. 4a illustrates a section of a semiconductor component corresponding to FIG. 3a, the semiconductor body 1 having been partially removed by the etching method not only its edge region 41 but also in its inner region 40, in particular in the region of the first semiconductor zone 12.

Figure 4B:
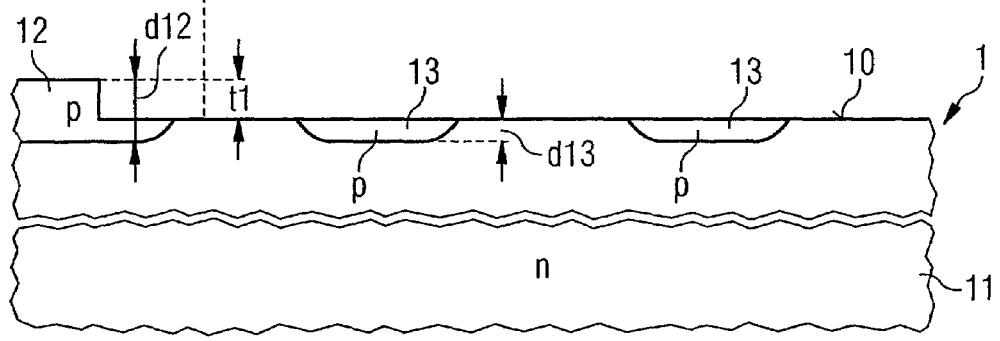
FIG. 4b illustrates in cross section the section of the semiconductor component in accordance with FIG. 4a after the removal of the etching mask.

FIG. 4b illustrates the section of the semiconductor component in accordance with FIG. 4a after the removal of the doping mask 22. As a result of the first semiconductor zone 12 being partially removed by an etching technique, the properties of said first semiconductor zone can also be adapted. As a result of the partial removal of the first semiconductor zone 12, charges are removed from the p-doped well, which leads to a lower density of the equipotential lines and thus to a reduced field strength in the region of the p-doped well 12.

The number of second semiconductor zones 13 reduced in size by means of the method described with reference to FIGS. 2 to 4b is arbitrary, in principle. In particular, it is also possible to fabricate second semiconductor zones 13 of different thicknesses. By way of example, the thickness d13 of a second semiconductor zone 13 may be chosen in a manner dependent on the distance between said second semiconductor zone and the first semiconductor zone 12 in the lateral direction of the semiconductor body 1. In this case, the thickness d13 of the second semiconductor zones 13 may in particular increase or decrease with increasing distance in the lateral direction of the semiconductor body 1.

The first method illustrated can also be used to reduce the dimensions of the second semiconductor zones 13 in the lateral direction of the semiconductor body 1 since these are etched proceeding from the first side 10 of the semiconductor body 1, where their dimensions in the lateral direction of the semiconductor body 1 are greatest.

The second method according to the invention is explained below with reference to FIGS. 5 to 11.

Figure 5:
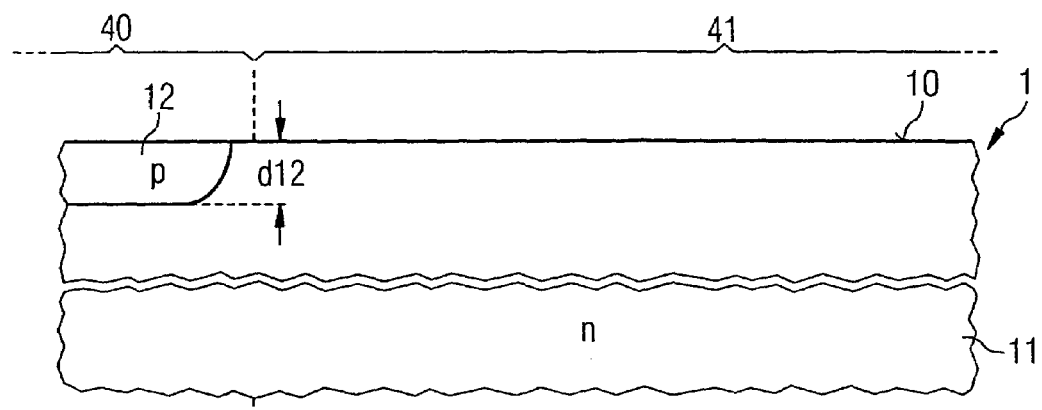
FIG. 5 illustrates a section of a semiconductor component having an inner region in cross section and an edge region, the inner region having a first semiconductor zone.

As shown in FIG. 5, a semiconductor body 1 is provided. The semiconductor body 1 has an inner region 40 and also an edge region 41 adjacent to the inner region 40 in the lateral direction of the semiconductor body 1. In its inner region 40, the semiconductor body 1 comprises a first p-doped semiconductor zone 12, which extends into the semiconductor body 1 proceeding from a first side 10 of the semiconductor body 1. The first semiconductor zone 12 has a thickness d12, that is to say its dimension in the vertical direction of the semiconductor body 1.

Figure 6:
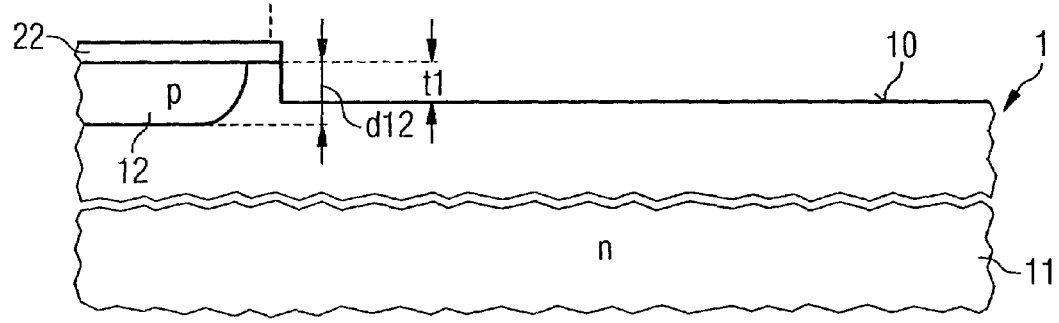
FIG. 6 illustrates cross section the section of the semiconductor component in accordance with FIG. 5 in which the semiconductor body has been partially removed in its edge region after the application of a patterned etching mask.

As is illustrated as the result in FIG. 6, after it has been provided, the semiconductor body 1 is provided with a patterned etching mask 22 on its first side 10, which mask covers the inner region 40, in particular the first semiconductor zone 12. During an etching process, the semiconductor body 1 is etched as far as an etching depth t1 proceeding from its first side 10 at the regions not covered by the etching mask. In this case, the etching may extend completely over the outer region 41. However, it is equally possible for the outer region 41 to be etched in patterned fashion. The first side 10 of the semiconductor body 1 is preferably stepped after the etching process.

After the removal of the etching mask 22, a patterned doping mask 21 is applied to the first side 10 of the semiconductor body 1. The patterned doping mask 21 has, at least in the outer region 41, one or more cutouts through which dopants are introduced into the semiconductor body 1 by means of an implantation step proceeding from the first side 10.

After a heat treatment step during which the semiconductor body 1 is heated to an elevated temperature, diffusion processes may give rise to a propagation of the implanted regions—as already explained with reference to FIG. 2. After the heat treatment process, if such a process is provided, the first semiconductor zone 12 and the second semiconductor zones 13, as illustrated in FIG. 6, have their final thicknesses d12 and d13, respectively. The temperature during the optional heat treatment step is preferably at least 800° C. in the case where boron is used as dopant material.

Figure 7:
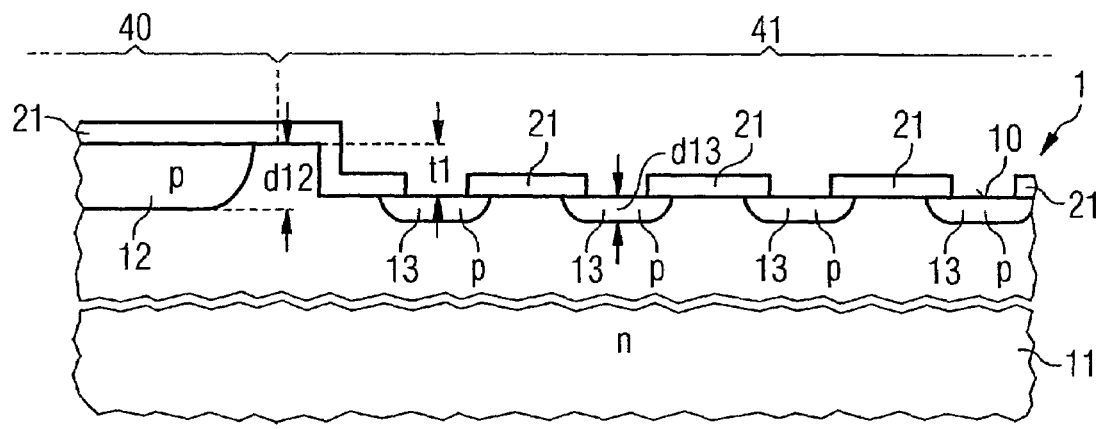
FIG. 7 illustrates in cross section the section of the semiconductor component in accordance with FIG. 6 in which, after the removal of the patterned etching mask, a number of second semiconductor zones have been produced in the edge region of the semiconductor body using a patterned doping mask.

As is illustrated with reference to FIG. 7, the dimensions of the second semiconductor zones 13 in the lateral direction of the semiconductor body 1 are greater than the dimensions of the relevant openings of the doping mask 21 in the same lateral direction.

Figure 8:
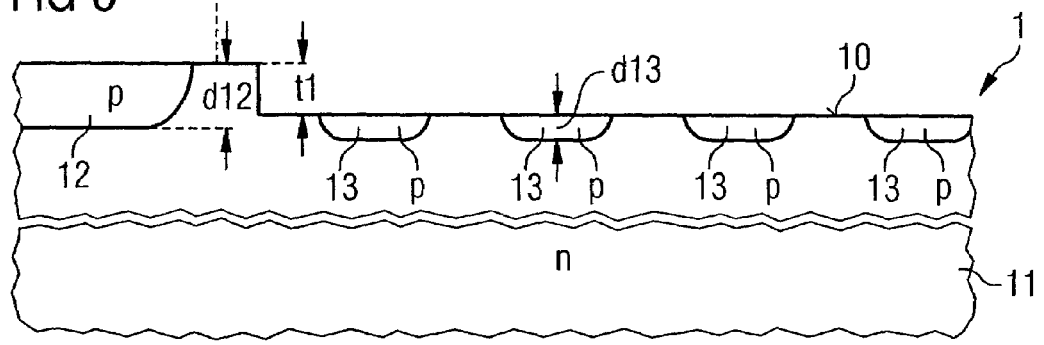
FIG. 8 illustrates in cross section the section of the semiconductor component in accordance with FIG. 7 after the removal of the patterned doping mask.

Optionally, the doping mask 21 may also have cutouts in its inner region 40, in particular in the region of the second semiconductor zone 12, through which cutouts dopants are also introduced into the inner region 40, in particular into the first semiconductor zone 12, during the aforementioned implantation process. It is thus possible to set the doping profile or the quantity of dopant in the inner region 40 or in the first semiconductor zone 12. The finished processed edge structure of the semiconductor component in accordance with FIG. 7 after the removal of the doping mask 21 is illustrated in FIG. 8.

Figure 9:
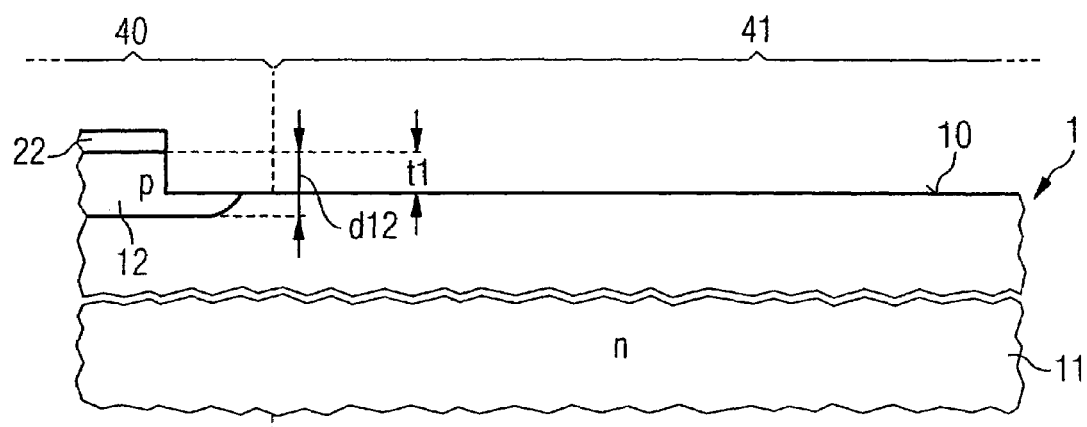
FIG. 9 illustrates in cross section a section of a semiconductor component corresponding to FIG. 6 in which the second semiconductor zone has been partially removed during the technical etching method.

FIG. 9 illustrates a semiconductor component corresponding to FIG. 6 in cross section, the etching mask 22 having cutouts in the inner region 40, in particular in the region of the first semiconductor zone 12, so that, during the etching method already outlined with reference to FIG. 6, the semiconductor body 1 is also partially removed in the inner region, preferably in the region of the first semiconductor zone 12.

Figure 10:
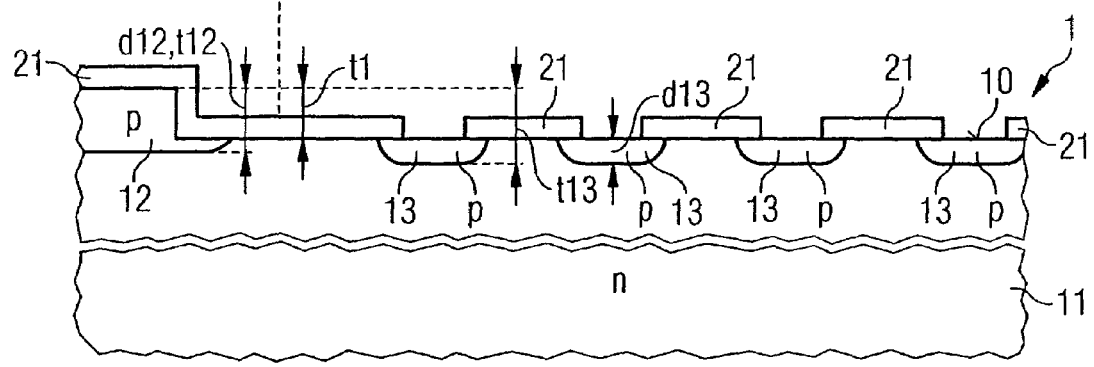
FIG. 10 illustrates the section of the semiconductor component in accordance with FIG. 9 in which, after the removal of the etching mask, a number of second semiconductor zones have been produced using a patterned doping mask.

FIG. 10 illustrates the semiconductor component in accordance with FIG. 9 in which, after the removal of the etching mask 22, a patterned doping mask 21 has been applied to the first side 10 of the semiconductor body 1. The doping mask 21 has one or more openings at least in the outer region 41 of the semiconductor body 1, through which openings dopants such as e.g. the p-doping boron are introduced into the semiconductor body 1. After a heat treatment process during which the semiconductor body 1 is brought to an elevated temperature, the implanted regions of the semiconductor body expand in the lateral and vertical direction of the semiconductor body 1 on account of diffusion processes, so that ultimately the first semiconductor zone 12 and the second semiconductor zones 13 are present as illustrated in FIG. 10.

Since the second semiconductor zones 13 have been fabricated independently of the first semiconductor zone 12, their penetration depth t13 can be chosen independently of the corresponding penetration depth t12 of the first semiconductor zone 12. In this case, the penetration depths t12, t13 respectively relate to the first side 10 of the semiconductor body 1 as illustrated in FIG. 5, that is to say to the first side 10 that has not yet been etched.

This method makes it possible to choose the penetration depths t13 of the second semiconductor zones 13 to be less than or equal to, preferably greater than, the penetration depth t12 of the first semiconductor zone 12.

The individual second semiconductor zones 13 may have, among one another, both the same and different penetration depths t13. By way of example the penetration depth t13 of a second semiconductor zone 13 may be chosen to be larger or smaller the further away it is from the first semiconductor zone 12 in the lateral direction of the semiconductor body 1.

In a corresponding manner, the final thicknesses d13 of the second semiconductor zones 13 may also be identical or different and, for example, depend on the distance between said second semiconductor zones and the first semiconductor zone 12 in the lateral direction of the semiconductor body 1 and increase or decrease, for example, with increasing distance.

Figure 11:
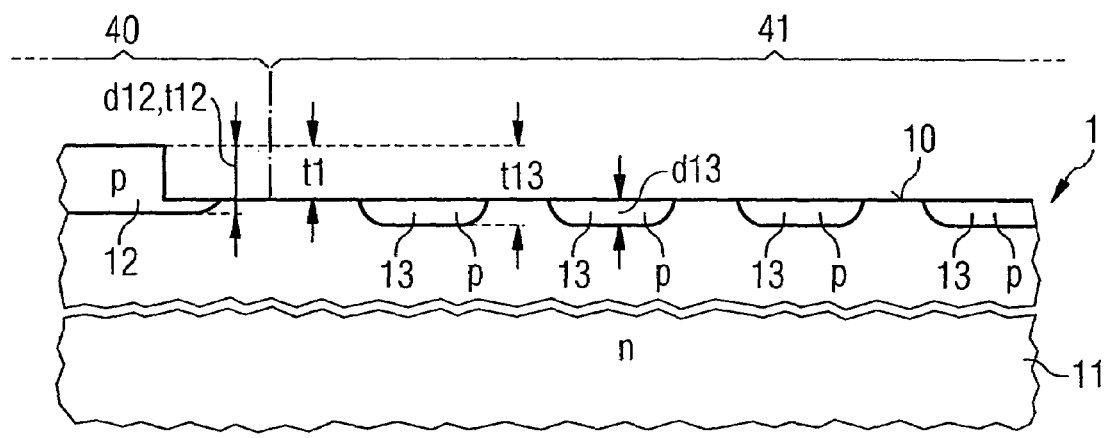
FIG. 11 illustrates in cross section the section of the semiconductor component in accordance with FIG. 10 after the removal of the patterned etching mask.

FIG. 11 illustrates a section of the semiconductor component in accordance with FIG. 10 after the removal of the patterned doping mask 21. The heat treatment steps explained with reference to FIGS. 2, 7 and 10 may be carried out both before—as illustrated—but also after the removal of the doping mask 21.

By virtue of the fact that the second semiconductor zones 13 are produced independently of the first semiconductor zone 12 by means of the method described with reference to FIGS. 1 to 11, it is possible to reduce the distance between adjacent second semiconductor zones 13 in the lateral direction of the semiconductor body 1 in comparison with the prior art since the lateral enlargement of a second semiconductor zone 13 caused by the heat treatment step, on account of diffusion, depends on the thickness thereof in the vertical direction of the semiconductor body 1. If only small thicknesses d13 are chosen for the second semiconductor zones 13, then they are also accompanied by small dimensions in the lateral direction of the relevant semiconductor zones 13. Consequently, for a predetermined width of the edge region 41, more second semiconductor zones 13 can be introduced into the edge region 41 by means of the methods according to the invention than by a method in accordance with the prior art.

Component simulations using the example of a 1700 V diode have revealed that the static breakdown voltage can be raised from 2150 V to 2625 V if the number of second semiconductor zones 13 is increased from three according to a conventional design to fifteen in the manner proposed here.

The first conduction type of the field zones or field rings fabricated by means of the methods described above may be both of the n conduction type and of the p conduction type. A field zone or a field ring is preferably embedded in a complementarily doped third semiconductor zone 11, so that a pn junction is formed between the second conduction zone and the third semiconductor zone.

The methods according to the invention can be employed in particular for fabricating second field zones 13 in the case of a diode, in which the first semiconductor zone 12 forms the p-doped emitter of the diode.

Even though the present invention has been described on the basis of a diode, it should be pointed out that the method is not, of course, restricted to the fabrication of edge terminations for diodes, but rather can be applied to the fabrication of edge terminations of arbitrary vertical power components, in particular thyristors, IGBTs or MOSFETs.

In the case of a diode, the first p-doped semiconductor zone 12 forms the p-type emitter thereof. In the case of a thyristor, the first semiconductor zone 12 explained above forms the p-type base thereof, in which an n-doped emitter (not illustrated in the figures) is arranged in a sufficiently known manner. In the case of a thyristor, the n-doped semiconductor zone 11 explained above forms the n-type base thereof.

In the case of an IGBT, the first semiconductor zone forms the p-type base or body zone thereof, in which an n-doped emitter (not illustrated in the figures) is arranged in a sufficiently known manner. In the case of an IGBT, the n-doped semiconductor zone 11 explained above forms the n-type base thereof or the drift zone thereof.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for fabricating a semiconductor having at least one field zone comprising:

providing a semiconductor body having an inner region, an edge region adjoining the inner region in a lateral direction of the semiconductor body, and a first side, the semiconductor body comprising a first semiconductor zone of a first conduction type in the inner region and at least one second semiconductor zone of the first conduction type in the edge region, the at least one second semiconductor zone having a dimension in a vertical direction of the semiconductor body and extending into the semiconductor body proceeding from the first side; and patterned etching of the semiconductor body proceeding from the first side as far as a predetermined etching depth at least in the edge region in order to partially remove and reduce the dimension of the at least one second semiconductor zone in the vertical direction of the semiconductor body, wherein the at least one second semiconductor zone forms a field zone in the edge region of the semiconductor body.

2. The method of claim 1, comprising:
completely preserving the first semiconductor zone during the patterned etching of the semiconductor body.

3. The method of claim 1, comprising:
removing the first semiconductor zone in sections by the patterned etching.

4. The method of claim 1, comprising:
effecting the etching of the semiconductor body using a patterned etching mask applied to the first side.

5. The method of claim 4, comprising:
removing the patterned etching mask from the first side at least in sections after the etching.

6. The method of claim 1, comprising:
defining the etching depth to be less than the vertical thickness of the at least one second semiconductor zone.

7. The method of claim 1, comprising:
defining the each of the at least one second semiconductor zones to have the same vertical thickness.

8. A method for fabricating a semiconductor having at least one field zone comprising:

providing a semiconductor body having an inner region, an edge region adjoining the inner region in a lateral direction of the semiconductor body, and a first side, the semiconductor body comprising a first semiconductor zone of a first conduction type in the inner region and at least one second semiconductor zone of the first conduction type in the edge region, the second semiconductor zone having a specific dimension in the vertical direction of the semiconductor body and extending into the semiconductor body proceeding from the first side;

patterned etching of the semiconductor body proceeding from the first side as far as a predetermined etching depth at least in the edge region in order to partially remove the at least one second semiconductor zone; and fabricating the at least one second semiconductor zone as a semiconductor zone formed in floating fashion.

9. A method for fabricating a semiconductor having a least one field zone comprising:

providing a semiconductor body having an inner region, an edge region adjoining the inner region in a lateral direction of the semiconductor body, and a first side, the semiconductor body comprising a first semiconductor zone of the first conduction type in the inner region and at least one second semiconductor zone of the first conduction type in the edge region, the second semiconductor zone having a specific dimension in the vertical direction of the semiconductor body and extending into the semiconductor body proceeding from the first side;

patterned etching of the semiconductor body proceeding from the first side as far as a predetermined etching depth at least in the edge region in order to partially remove the at least one second semiconductor zone; and forming the at least one second semiconductor zone in annular fashion and is arranged around the first semiconductor zone.

10. The method of claim 1, comprising:
choosing the first conduction type to be p-conducting.

11. The method of claim 1, comprising:
choosing the first conduction type to be n-conducting.

12. A method for fabricating at least one field zone of a semiconductor component, comprising:

providing a semiconductor body having an inner region, an edge region adjoining the inner region in a lateral direction of the semiconductor body, and also a first side, the semiconductor body comprising a first semiconductor zone of a first conduction type in the inner region, the first semiconductor zone having a specific dimension in the vertical direction of the semiconductor body and extending into the semiconductor body proceeding from the first side;

etching the semiconductor body at least in the edge region proceeding from the first side as far as a predetermined etching depth; and producing at least one second semiconductor zone of the first conduction type having a predetermined dimension in the vertical direction of the semiconductor body by introduction of dopants into the edge region of the semiconductor body, wherein the at least one second semiconductor zone forms the at least one field zone in the edge region of the semiconductor body.

13. The method of claim 12, comprising:
partially removing the first semiconductor zone during the etching of the semiconductor body.

14. The method of claim 12, comprising:
completely preserving the first semiconductor zone during the patterned etching of the semiconductor body.

15. The method of claim 12, comprising:
effecting the etching of the semiconductor body using a patterned etching mask applied to the first side.

16. The method of claim 15, comprising:
removing the patterned etching mask from the first side at least in sections after the etching.

17. The method of claim 12, comprising:
introducing the dopants into the semiconductor body proceeding from the first side using a patterned doping mask applied to the first side.

18. The method of claim 17, comprising:
removing the patterned doping mask from the first side at least in sections after the introduction of the dopants.

19. The method of claim 12, comprising:
heating the semiconductor body to a temperature of more than 800° C. after the introduction of the dopants.

20. The method of claim 12, comprising:
defining the dimension of the at least one second semiconductor zone in the vertical direction of the semiconductor body to be greater than or equal to the difference between the dimension of the second semiconductor zone in the vertical direction of the semiconductor body and the etching depth.

21. A method for fabricating at least one field zone of a semiconductor component, comprising:
providing a semiconductor body having an inner region, an edge region adjoining the inner region in a lateral direction of the semiconductor body, and also a first side, the semiconductor body comprising a first semiconductor zone of a first conduction type in the inner region, the first semiconductor zone having a specific dimension in the vertical direction of the semiconductor body and extending into the semiconductor body proceeding from the first side;
etching the semiconductor body at least in the edge region proceeding from the first side as far as a predetermined etching depth;
producing at least one second semiconductor zone of the first conduction type having a predetermined dimension in the vertical direction of the semiconductor body by introduction of dopants into the edge region of the semiconductor body; and
fabrication the at least one second semiconductor zone is fabricated as a semiconductor zone formed in floating fashion.

22. A method for fabricating at least one field zone of a semiconductor component, comprising:
providing a semiconductor body having an inner region, an edge region adjoining the inner region in a lateral direction of the semiconductor body, and also a first side, the semiconductor body comprising a first semiconductor zone of a first conduction type in the inner region, the first semiconductor zone having a specific dimension in the vertical direction of the semiconductor body and extending into the semiconductor body proceeding from proceeding from the first side;
etching the semiconductor body at least in the edge region proceeding from the first side as far as a predetermined etching depth;
producing at least one second semiconductor zone of the first conduction type having a predetermined dimension in the vertical direction of the semiconductor body by introduction of dopants into the edge region of the semiconductor body; and
forming the at least one second semiconductor zone in annular fashion and is arranged around the first semiconductor zone.

23. The method of claim 12, comprising:
defining the first conduction type to be p-conducting.

24. The method of claim 12, comprising:
defining the first conduction type to be n-conducting.

25. The method of claim 24, comprising:
using the method for fabricating field zones of a thyristor, in which the first semiconductor zone forms a p-doped base of the thyristor.

26. The method of claim 24, comprising:
using the method for fabricating field zones of an IGBT, in which the first semiconductor zone forms the p-type base or body zone of the IGBT.

27. The method of claim 24, comprising:
using the method for fabricating field zones of a diode, in which the first semiconductor zone forms a p-type emitter of the diode.

28. A method for fabricating at least one field zone of a semiconductor component, comprising:
providing a semiconductor body having an inner region, an edge region adjoining the inner region in a lateral direction of the semiconductor body, and also a first side, the semiconductor body comprising a first semiconductor zone of a first conduction type in the inner region, the first semiconductor zone having a specific dimension in the vertical direction of the semiconductor body and extending into the semiconductor body proceeding from the first side;
etching the semiconductor body at least in the edge region proceeding from the first side as far as a predetermined etching depth;
producing at least one second semiconductor zone of the first conduction type having a predetermined dimension in the vertical direction of the semiconductor body by introduction of dopants into the edge region of the semiconductor body, wherein the at least one second semiconductor zone forms a field zone in the edge region of the semiconductor body;
partially removing the first semiconductor zone during the etching of the semiconductor body;
effecting the etching of the semiconductor body using a patterned etching mask applied to the first side;
removing the patterned etching mask from the first side at least in sections after the etching; and
introducing the dopants into the semiconductor body proceeding from the first side using a patterned doping mask applied to the first side.

29. The method of claim 28, comprising:
removing the patterned doping mask from the first side at least in sections after the introduction of the dopants.

* * * * *